United States Patent
Raghunathan et al.

(10) Patent No.: US 8,363,485 B2
(45) Date of Patent: Jan. 29, 2013

(54) DELAY LINE THAT TRACKS SETUP TIME OF A LATCHING ELEMENT OVER PVT

(75) Inventors: Ashwin Raghunathan, Santa Clara, CA (US); Marzio Pedrali Noy, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 514 days.

(21) Appl. No.: 12/559,585

(22) Filed: Sep. 15, 2009

(65) Prior Publication Data

US 2011/0063929 A1    Mar. 17, 2011

(51) Int. Cl.
*G11C 7/10*    (2006.01)
*G11C 7/22*    (2006.01)

(52) U.S. Cl. ............ 365/189.05; 365/189.15; 365/193; 365/194; 365/233.1; 365/233.13

(58) Field of Classification Search ............ 365/189.05, 365/189.15, 193, 194, 233.1, 233.13
See application file for complete search history.

(56) References Cited

U.S. PATENT DOCUMENTS

| | | | |
|---|---|---|---|
| 6,362,657 B1 | 3/2002 | Mooney | |
| 6,417,715 B2 | 7/2002 | Hamamoto et al. | |
| 7,405,603 B2 | 7/2008 | Ku | |
| 7,940,100 B2 * | 5/2011 | Keskin et al. | ............ 327/161 |
| 2006/0082400 A1 | 4/2006 | Isono | |
| 2009/0079483 A1 | 3/2009 | Keskin et al. | |
| 2009/0108895 A1 | 4/2009 | Saint-Laurent et al. | |

OTHER PUBLICATIONS

International Search Report and Written Opinion—PCT/US2010/048822, International Search Authority—European Patent Office—Dec. 15, 2010.

* cited by examiner

*Primary Examiner* — J. H. Hur
(74) *Attorney, Agent, or Firm* — Eric Ho

(57) ABSTRACT

A latching element latches incoming data into an integrated circuit. The latching element (for example, a latch or flip-flop) can be considered to include a data path portion, a clock path portion, and an ideal latching element. In one embodiment, an open-loop replica of the data path portion is disposed in a clock signal path between a clock input terminal of the integrated circuit and a clock input lead of the latching element. In a second embodiment, an additional replica of the clock path portion is disposed in a data signal path between a data terminal of the integrated circuit and a data input lead of the latching element. The replica circuits help prevent changes in skew between a data path propagation time to the ideal latching element and clock path propagation time to the ideal latching element. Setup times remain substantially constant over PVT (process, supply voltage, temperature).

29 Claims, 6 Drawing Sheets

EMBODIMENT ONE

OPEN-LOOP REPLICA OF DATA PATH PORTION

DDR READ TIMING

INTERNAL STRUCTURE OF A LATCHING ELEMENT

EMBODIMENT ONE

LATCHING ELEMENT

OPEN-LOOP REPLICA OF DATA PATH PORTION

EMBODIMENT TWO

REPLICA OF CLK PATH PORTION

DELAY LINE THAT TRACKS SETUP TIME OF A LATCHING ELEMENT OVER PVT

BACKGROUND INFORMATION

1. Technical Field

The disclosed embodiments relate to the latching of incoming data, and more particularly to a delay line that automatically tracks the setup time of a latching element across PVT (process, supply voltage, temperature) variations.

2. Background Information

A high-speed input/output (I/O) interface between a processor device and a Double-Data Rate (DDR) Synchronous Dynamic Random Access Memory (SDRAM) device is designed to accommodate the reading/writing of data on both the rising and falling edges of a strobe signal. The strobe signal is also referred to as a clock signal. Such a high-speed I/O interface should work reliably across process, voltage and temperature (PVT) variations given a small "data-valid" window. The data-valid window can be significantly less than a half-clock period of the strobe signal due to duty cycle distortion effects, timing uncertainties (jitter), and setup-hold requirements.

FIG. 1 (Prior Art) is a diagram of a high-speed I/O interface in the read path between a processor device 1 and a DDR SDRAM device 2. The incoming strobe signal DQS is nominally edge-aligned with the data signals D[7:0] received from the external DDR SDRAM. The strobe DQS and the data signals D[7:0] are edge-aligned to one another as these signals are received onto the processor device 1 that is reading the data from the DDR SDRAM device 2. A delay circuit is used to delay the incoming strobe signal DQS with respect to the incoming data D[7:0] by a time Tsd to produce a positive delayed strobe signal DQS_PE. Similarly, the delay circuit is used to delay the incoming strobe signal DQS with respect to the incoming data D[7:0] signals by time Tsd to produce a negative delayed strobe signal DQS_NE. The value of Tsd is such that the delayed strobes DQS_PE and DQS_NE fall in the data-valid window for a given operating frequency.

FIG. 2 (Prior Art) is a diagram that illustrates the DQS_PE and DQS_NE strobes, the delay time Tsd, and the data-valid windows. One technique that has been used to control the Tsd value involves use of a Calibrated Delay Circuit (CDC). The CDC involves a programmable delay array 3 in combination with a calibration engine 4. The CDC produces delay Tsd that is constant across PVT. Tsd is selected such that the delayed strobe DQS_PE is centered within a first data-valid window shown in FIG. 2. The DQS_PE strobe (the rising edge of DQS_PE) is therefore usable to latch in a first eight bits of data D[7:0] that is valid within the first data-valid window. The delayed strobe DQS_NE is similarly centered within a second data-valid window. The DQS_NE strobe (the rising edge of DQS_NE) is therefore usable to latch in a second eight bits of data D[7:0] that is valid within the second data valid-window. For a given temperature and supply voltage, the calibration engine determines the number of programmable delay array elements needed to produce Tsd. This information is conveyed to programmable delay array 3 in the form of a calibration code CAL_CODE[N:0]. In practice, the temperature of the circuit changes depending upon ambient conditions and the supply voltage is intentionally scaled up or scaled down depending on the usage mode of the processor. A scaled up supply voltage may, for example, be used in a high performance/high power usage mode, whereas a scaled down supply voltage may be used in a low performance/low power usage mode.

Such changes in temperature and supply voltage may cause the DQS_PE and DQS_NE strobes to deviate from their centered position within their respective data-valid windows, and may even cause the DQS_PE and DQS_NE strobes to fall outside their respective data-valid windows. This may result in memory access failures. This problem can be addressed by operating calibration engine 4 continuously and updating the programmable delay array 3 whenever there is a change in calibration code. However, this approach results in increased power consumption due to continuous operation of the calibration engine. Moreover, memory access operations have to be suspended whenever the calibration code is being updated, thereby reducing overall system performance due to associated memory latency.

SUMMARY

A latching element (such as a latch or a flip-flop of a register) is used to latch incoming data into an integrated circuit. The latching element can be considered to include a data path portion, a clock path portion, and an ideal latching element. The data path portion is in a data signal path between a data input lead of the latching element and a data input lead of the ideal latching element. The clock path portion is in a clock signal path between a clock input lead of the latching element and a clock input lead of the ideal latching element. In one embodiment, an open-loop replica of the data path portion is disposed in a clock signal path between a clock input terminal of the integrated circuit and the clock input lead of the latching element. In a second embodiment, an additional replica of the clock path portion is disposed in a data signal path between a data terminal of the integrated circuit and the data input lead of the latching element. The replica circuits help prevent changes in skew between data path propagation time to the ideal latching element and clock path propagation time to the ideal latching element. Setup time (into the latching element from the perspective of a device external to the integrated circuit) remains substantially constant over PVT (process, supply voltage, temperature) variations.

The foregoing is a summary and thus contains, by necessity, simplifications, generalizations and omissions of detail; consequently, those skilled in the art will appreciate that the summary is illustrative only and does not purport to be limiting in any way. Other aspects, inventive features, and advantages of the devices and/or methods described herein, as defined solely by the claims, will become apparent in the non-limiting detailed description set forth herein.

DETAILED DESCRIPTION

Figure 1:
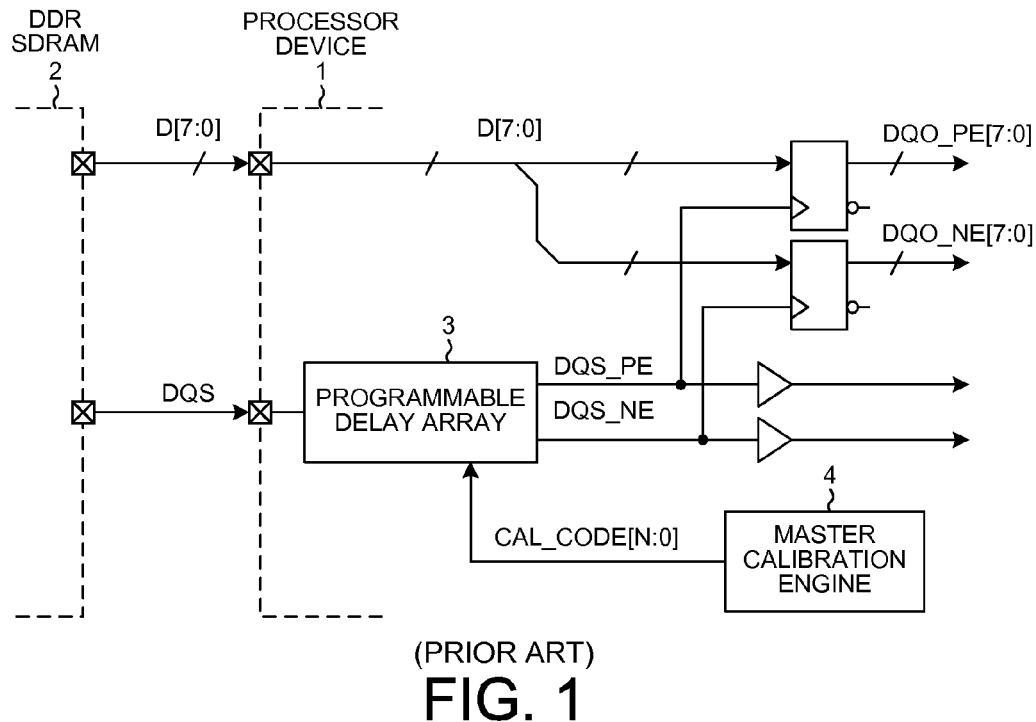
FIG. 1 (Prior Art) is a diagram of a conventional high-speed I/O interface for interfacing to a Double-Data Rate (DDR) Synchronous Dynamic Random Access Memory (SDRAM) device.
Figure 2:
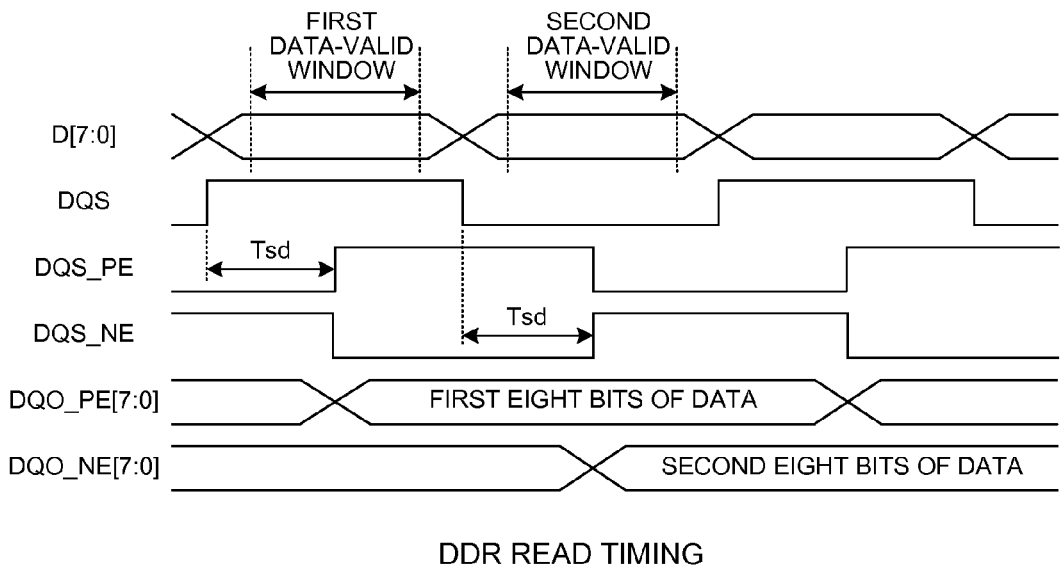
FIG. 2 (Prior Art) is a waveform diagram that illustrates operation of the interface of FIG. 1.
Figure 3:
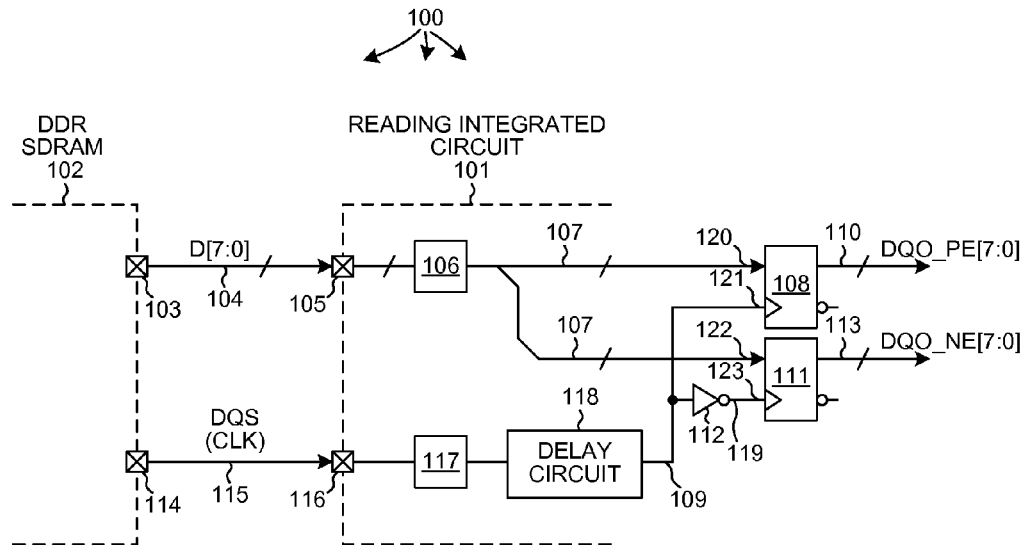
FIG. 3 is a simplified diagram of a first embodiment of a system in accordance with a first novel aspect.

FIG. 3 is a simplified diagram of a first embodiment of a system 100 in accordance with one novel aspect. System 100 includes a first integrated circuit 101 that reads information from a second integrated circuit 102. In the specific embodiment illustrated, second integrated circuit 102 is a Double-Data Rate (DDR) Synchronous Dynamic Random Access Memory (SDRAM) integrated circuit. First integrated circuit 101 is a digital baseband integrated circuit. Both integrated circuits 101 and 102 are present within a cellular telephone handset. A first set of eight bits of data passes from eight data terminals 103 of integrated circuit 102, across a set of eight corresponding conductors 104, through eight corresponding data terminals 105 of integrated circuit 101, through eight corresponding input protection circuits 106, across an eight-bit bus 107, and onto the eight data input leads 120 of a first set of eight latching elements 108. Latching elements 108 are clocked on the rising edges of a data strobe signal DQS_PE (also referred to as a clock signal CLK) received via conductor 109 onto clock input leads 121 of the first set of latching elements. The latching elements may, for example, be edge-triggered flip-flops or level-sensitive transparent latches. The first plurality of latching elements 108 may be a register of edge-triggered flip-flops or a register of level-sensitive latches. In the event the latching elements 108 are flip-flops, each flip-flop may include two latches where each latch is operable in a transparent mode and in a latched mode.

Once the first set of eight data bits has been latched into the first set of latching elements 108, the eight data bits appear on eight corresponding conductors 110 as DQO_PE[7:0]. Similarly, a second set of eight bits of data passes from terminals 103 of integrated circuit 102, across the eight conductors 104, through the eight data terminals 105 of integrated circuit 101, through the corresponding eight input protection circuits 106, across the eight-bit bus 107, and onto the eight data input leads 122 of a second set of eight latching elements 111. Latching elements 111 are clocked on the rising edges of the inverse of the strobe signal DQS_PE. This inverse signal DQS_NE is supplied by inverter 112 via conductor 119 onto clock input leads 123 of latching elements 111. Once the second set of eight data bits has been latched, the eight data bits appear on eight conductors 113 as DQO_NE[7:0]. In addition to outputting sets of data bits, integrated circuit 102 outputs a data strobe signal DQS onto terminal 114. The data strobe signal DQS passes across conductor 115, through clock input terminal 116, through input protection circuitry 117, and to delay circuit 118. In the manner described in further detail below, delay circuit 118 delays signal DQS, thereby generating the strobe signal DQS_PE that is supplied onto conductor 109.

Figure 4:
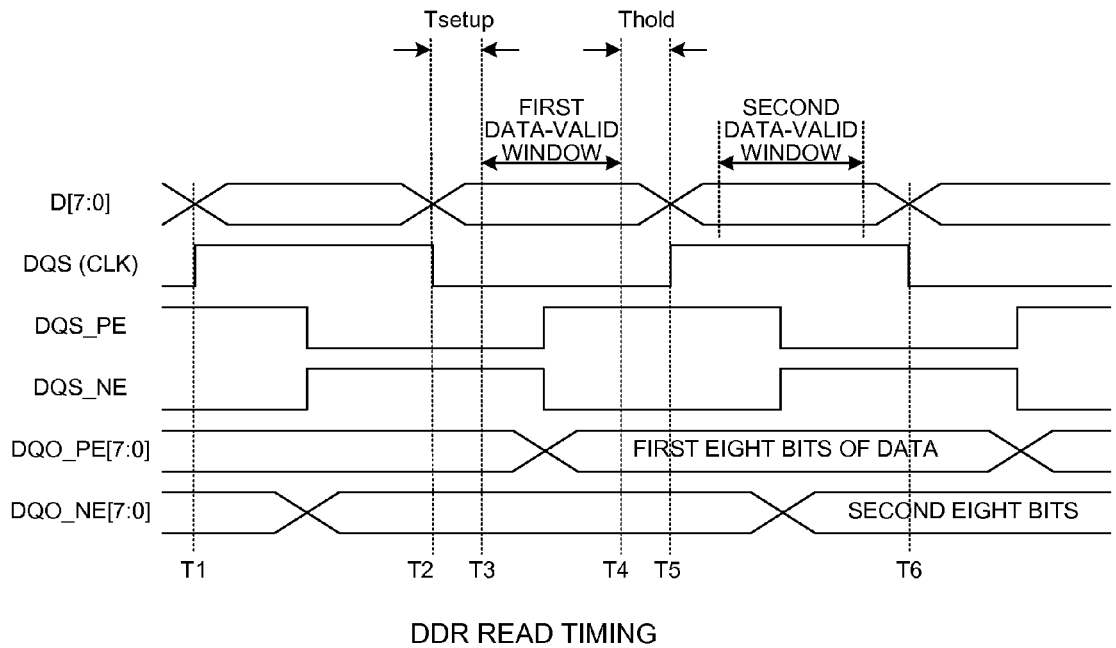
FIG. 4 is a waveform diagram that illustrates operation of the first embodiment of FIG. 3.

FIG. 4 is a waveform diagram that illustrates the latching of first and second sets of eight bits of data into the first set of latching elements 108 and into the second set of latching elements 111. Each latching element has a required setup time. The setup time of a latching element is an amount of time that data must be present on the data input lead of the latching element before the arrival of a latching rising edge of the strobe signal on the clock input lead of the latching element. Accordingly, the earliest time the rising edge of the strobe signal can occur while still meeting the setup time requirement is Tsetup time after time T2. This time is labeled T3 in the waveform diagram of FIG. 4. The "strobe" signal DQS is also referred to as a "clock" signal. If the data is not setup this amount of time before the rising edge of the strobe signal, then the latching element is not guaranteed to latch the data correctly.

Each latching element also has a required hold time. The hold time of a latching element is an amount of time that data must remain on the data input lead of the latching element after the latching rising edge of the strobe signal on the clock input lead of the latching element. If the data is not held this amount of time after the rising edge of the strobe signal, then the latching element is not guaranteed to latch the data correctly. In the example of FIG. 4, the data D[7:0] can change at times T1, T2, T5 and T6. If a data signal present on a data input lead of a latching element were to switch at time T2, then the rising edge of the strobe signal on the clock input lead of the latching element should not occur until Tsetup later at time T3. If a data signal present on the data input lead of the latching element were to switch to a new value at time T5, then the prior data value to be latched must remain on the data input lead Thold time after the rising edge of the strobe signal that clocked the data value into the latching element. Accordingly, the latest time the rising edge of the strobe signal can occur while still meeting the hold time requirement is Thold time before time T5. This time is labeled T4 in the waveform diagram of FIG. 4. The data-valid window when the strobe signal DQS_PE is permitted to transition high to latch the first eight bits of data therefore starts at time T3 and ends at time T4. A circuit is desired that delays the DQS signal as received onto integrated circuit 101 by an amount that is at least as large as Tsetup, and it is desired that the delay produced by this circuit track changes in the setup time of the latching elements across PVT. From FIG. 4 it is clear that if the rising edge of this delayed signal DQS_PE occurs at or slightly after time T3, then the setup time requirements of the latching element would always be met.

Figure 5:
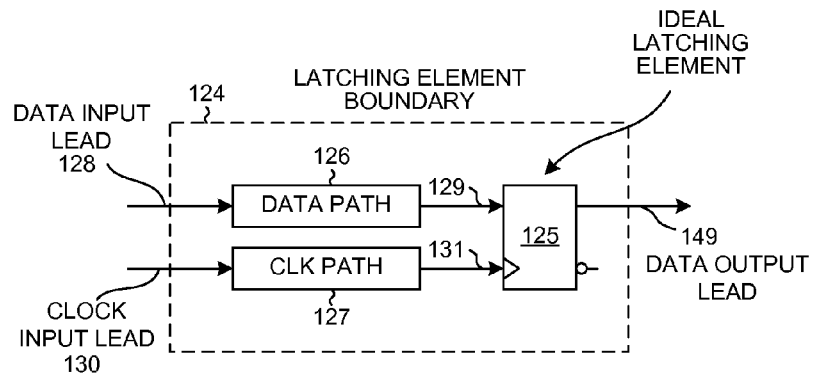
FIG. 5 is a diagram that illustrates the internal structure of one of the latching elements of the first set of latching elements 108 or one of the latching elements of the second set of latching elements 111 of FIG. 3.

FIG. 5 is a diagram that illustrates the internal structure of a latching element 124. Latching element 124 is one of the first set of latching elements 108. All latching elements of the first set of latching elements 108 and of the second set of latching element 111 are of identical layout and construction. Reference numeral 149 identifies the data output lead of latching element 124. The internal structure of latching element 124 can be conceptualized as including an ideal latching element 125 having zero setup time, an amount of data path circuitry 126 (also referred to here as the "data path portion" of the latching element), and an amount of clock path circuitry 127 (also referred to here as the "clock path portion" of the latching element). The structure within a real latching element that corresponds to the ideal latching element 125 is a part of the last stage of the latching element. The structure within a real latching element that corresponds to data path portion 126 usually includes structures internal to the latching element such as inverters, transmission gates and so forth that are in the signal path of a data signal between the latching element data input lead 128 and the data input lead 129 of the ideal latching element 125. The structure within a real latching element that corresponds to clock path portion 127 usually includes structures internal to the latching element such as inverters, transmission gates and so forth that are in the signal path of a clock signal between the latching element clock input lead 130 and the clock input lead 131 of the ideal latching element 125. If the delay as seen by the data signal between input lead 128 and input lead 129 is greater than the delay seen by the clock signal between clock input lead 130 and clock input lead 131, then the overall latching element 124 has a positive setup time requirement. Conversely, if the delay seen by the data signal between input lead 128 and input lead 129 is smaller than the delay seen by the clock signal between clock input lead 130 and clock input lead 131, then the overall latching element 124 has a negative setup time requirement.

Figure 6:
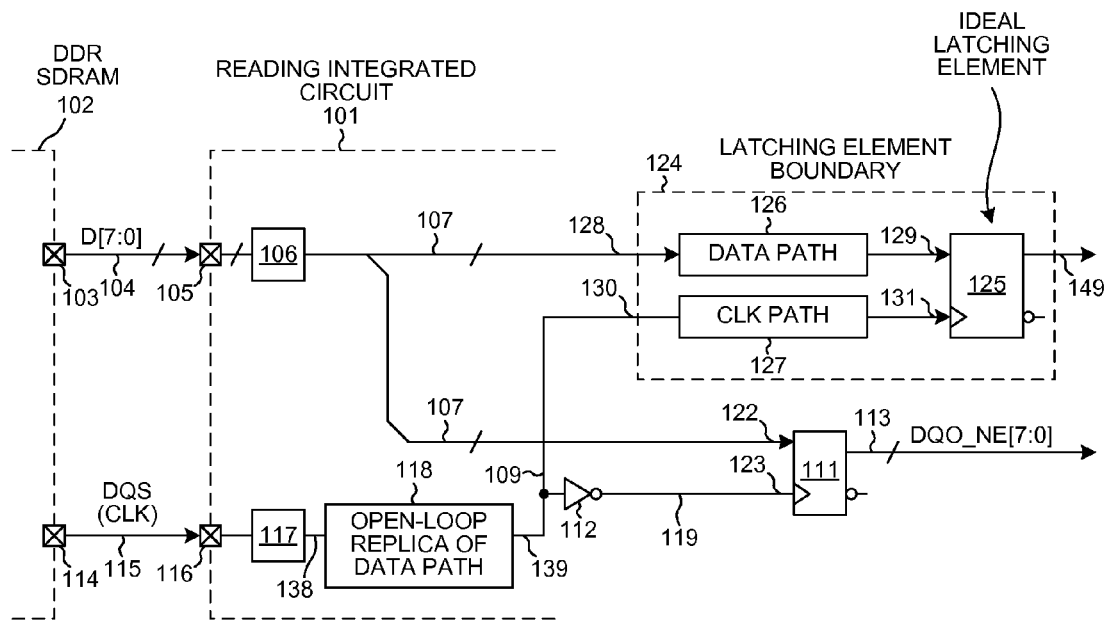
FIG. 6 is a circuit diagram of the first embodiment of FIG. 3. This circuit diagram shows data and clock signal paths from terminals of integrated circuit 101 into integrated circuit 101 and to the data and clock input leads of an ideal latching element 125.

FIG. 6 is a simplified diagram of a first embodiment of system 100 of FIG. 3. In FIG. 6, one of the latching elements 108 of FIG. 3 is illustrated as latching element 124 that includes the internal structures described above in connection with FIG. 5. Although only one latching element 124 is illustrated in FIG. 6, there are actually eight such latching elements 108 coupled in parallel. Delay circuit 118 is an open-loop replica of the data path portion 126 of latching element 124. This delay circuit 118 introduces a skew between the incoming data as received onto data input lead 129 of ideal latching element 125 and the incoming strobe signal as received onto clock input lead 131 of ideal latching element 125. The signal propagation delay from one of the data input terminals 105, through the corresponding input protection circuit 106, through data path portion 126, and to the data input lead 129 of ideal latching element 125 is Tprot plus Tdata. Tprot is the propagation delay through input protection circuits 117 and 106. The signal propagation delay from the clock input terminal 116, through input protection circuitry 117, through delay circuit 118, through the clock path portion 127 and to the clock input lead 131 of the ideal latching element 125 is Tprot plus Tdata plus Tclk. (The propagation delay from terminal 105 to the data input lead 128 of latching element 124 is assumed to match the propagation delay from clock input terminal 116 to the input lead 138 of open-loop replica 118.) Accordingly, if the data signal as received onto the data input terminal 105 of integrated circuit 101 is received at the same time as the strobe signal DQS onto clock input terminal 116, then the data signal will arrive on the input lead 129 of the ideal latching element 125 Tclk before the strobe signal is received on the clock input lead 131 of the ideal latching element 125. A setup time margin of Tclk is therefore guaranteed. If the data arriving at data input lead 129 is delayed more due to an increase in Tdata due to PVT changes, then the clock signal's arrival on clock input lead 131 is similarly delayed more. If the data arriving at data input lead 129 is delayed less due to decreases in Tdata due to PVT changes, then the clock signal's arrival on clock input lead 131 is similarly delayed less.

Figure 7:
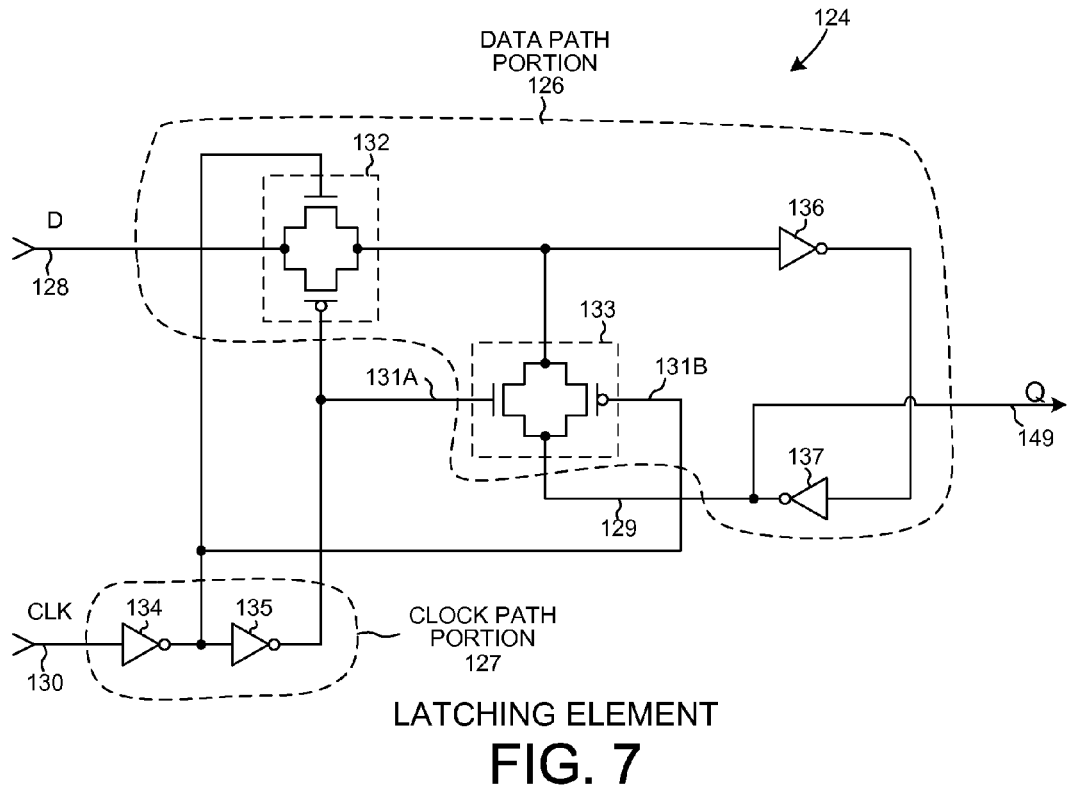
FIG. 7 is a diagram of one example of one of the latching elements 124 of FIG. 6.

FIG. 7 is a circuit diagram of latching element 124 of FIG. 6. This latching element 124 is one example of one of the latching elements of the first set of latching elements 108 and the second set of latching elements 111. Latching element 124 includes data path portion 126 and clock path portion 127. Data path portion 126 includes a transmission gate 132, an inverter 136, an inverter 137, and a transmission gate 133. Clock path portion 127 includes an inverter 134 and an inverter 135. Nodes 131A and 131B in FIG. 7 correspond to the clock input lead 131 in FIG. 6. Node 129 in FIG. 7 corresponds to data input lead 129 in FIG. 6.

Figure 8:
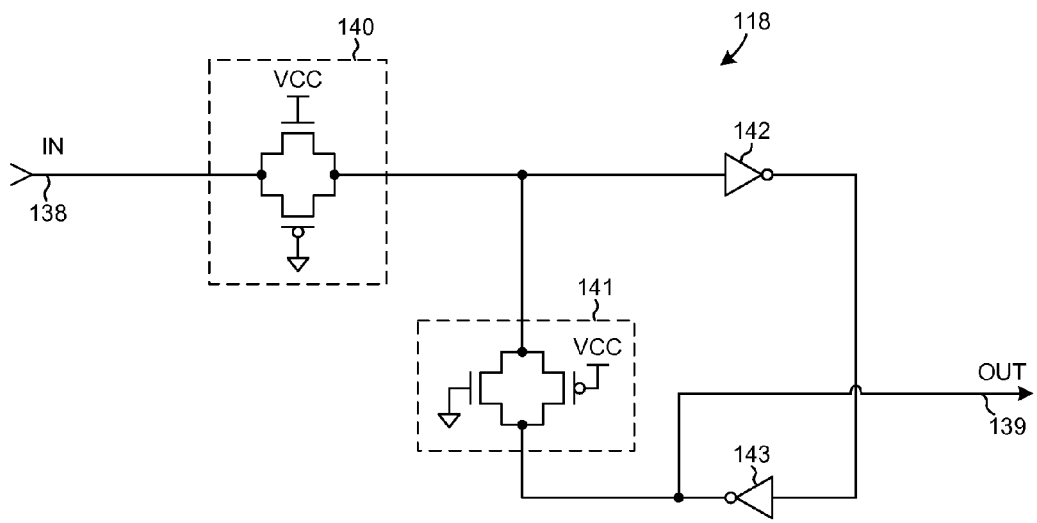
FIG. 8 is a diagram of one example of the open-loop replica 118 of FIG. 6. The sizes and layout of the various components illustrated in FIG. 8 are the same as the sizes and layout of corresponding components in FIG. 7.

FIG. 8 is a circuit diagram of the open-loop replica 118 of the data path portion of the latching element of FIG. 7. The input lead of the open-loop replica 118 is identified with reference numeral 138. The output lead of the open-loop replica 118 is identified with reference numeral 139. The replica 118 of FIG. 8 includes a replica of all the transistors of the data path portion 126 of FIG. 7. The sizes and layout of these transistors is the same in the replica of FIG. 8 as in data path portion 126 of FIG. 7, except that in the replica circuit of FIG. 8 the gates of transistors that do not receive the data signal are supplied with an appropriate one of the supply voltage VCC or ground potential so as to enable the data path from input lead 138 through the replica circuit 118 to output lead 139. Transmission gate 140 is enabled, whereas transmission gate 141 is disabled. The various nodes of the replica 118 of FIG. 8 through which the clock signal passes are loaded in the same way as corresponding nodes in the data path portion 126 of FIG. 7 are loaded. Accordingly, if the signal on input lead 138 of the replica circuit 118 of FIG. 8 transitions from a first digital logic state to a second digital logic state, then this signal transition will propagate through enabled transmission gate 140, through inverter 142, through inverter 143, and to output lead 139 such that the signal on output lead 139 transitions from the first digital logic state to the second digital logic state.

Figure 9:
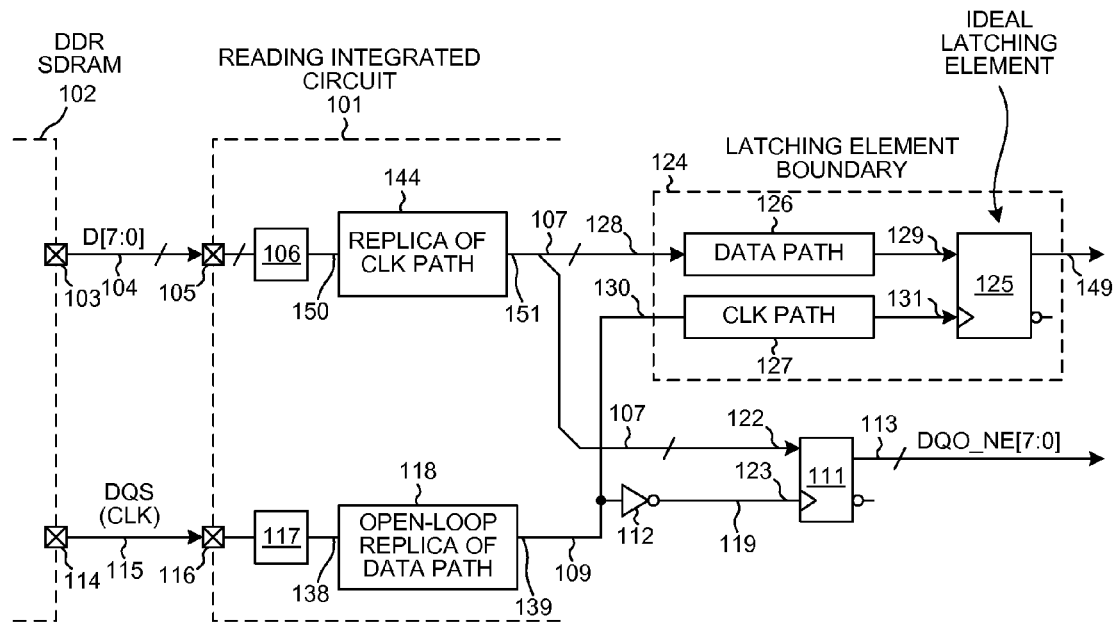
FIG. 9 is a simplified diagram of a second embodiment of a system in accordance with a second novel aspect. This second embodiment is similar to the first embodiment, except that in the second embodiment an additional replica 144 of the clock path is disposed in the data path between a data terminal 105 and the data input lead 129 of the ideal latching element 125. There is one such replica 144 in each data path.

FIG. 9 is a simplified diagram of a second embodiment of system 100 involving DDR SDRAM 102 and reading integrated circuit 101. This embodiment is the same as the first embodiment of FIG. 6 described above, except that in this second embodiment a replica 144 of the clock path portion 127 is provided in each data path between each of the data terminals 105 and its corresponding respective one of the data input leads 128 and data input leads 122. Accordingly, each of these data paths includes a replica 144 of the clock path portion 127 and also includes the data path portion 126. The clock path between clock input lead 116 and the clock input lead of the ideal latching element 125 of the corresponding latching element 124 includes the open-loop replica 118 of the data path portion as well as the clock path portion 127. The propagation delays through these two signal paths (the data signal path and the clock signal path) are therefore substantially identical, and the two propagation delays track one another across PVT. If Tclk is the propagation delay through clock path portion 127 and through replica 144, and if Tdata is the propagation delay through data path portion 126 and through open-loop replica 118, then if the propagation delays Tprot through input protection circuitry 106 and 117 are the same, then the propagation delays through the two signal paths (the data signal path and the clock signal path) are both the sum of Tprot and Tclk and Tdata. Whereas the setup time of the first embodiment of FIG. 6 is approximately minus Tclk (Tclk is the propagation delay through clock path portion 127), the setup time of this second embodiment of FIG. 9 is approximately zero. The circuitry through which a data signal passes on its way to the data input lead of the ideal latching element 125 is substantially identical to the circuitry through which a clock signal passes on its way to the clock input lead of the ideal latching element 125.

Figure 10:
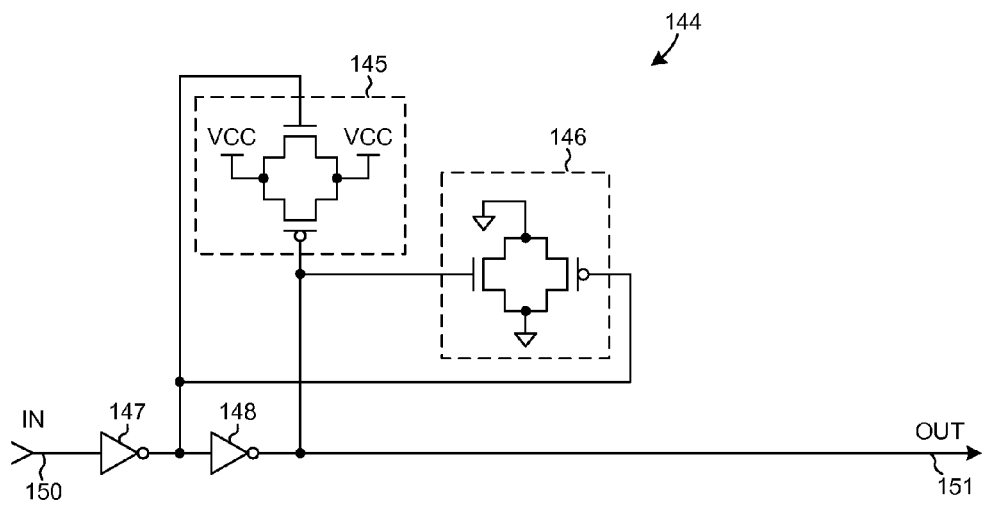
FIG. 10 is a simplified diagram of the replica 144 of the clock path of FIG. 9. The sizes and layout of the various components illustrated in FIG. 10 are the same as the sizes and layout of corresponding components in FIG. 7.

FIG. 10 is a circuit diagram of replica 144 of the clock path portion. This circuitry has the same circuit components and the same layout as the clock path portion 127 illustrated in the latching element 124 of FIG. 7. The input lead 150 of replica 144 is coupled to a corresponding one of the input protection circuits 106 in the data input path. The output lead 151 of replica 144 is coupled to a corresponding one of the data lines of eight-bit bus 107. In addition to inverters 147 and 148, replica 144 includes a replica 145 of transmission gate 132 of FIG. 7 as well as a replica 146 of transmission gate 133 of FIG. 7. The transmission gate replicas 145 and 146 are provided so that the inverters 147 and 148 will be capacitively loaded in the same way that inverters 134 and 135 in the circuit of FIG. 7 are capacitively loaded. In the embodiment of FIG. 9, there are eight instances of the replica circuit 144 of FIG. 10. One instance is in each of the eight data paths between the eight data input terminals 105 and the eight conductors of eight-bit bus 107.

Figure 11:
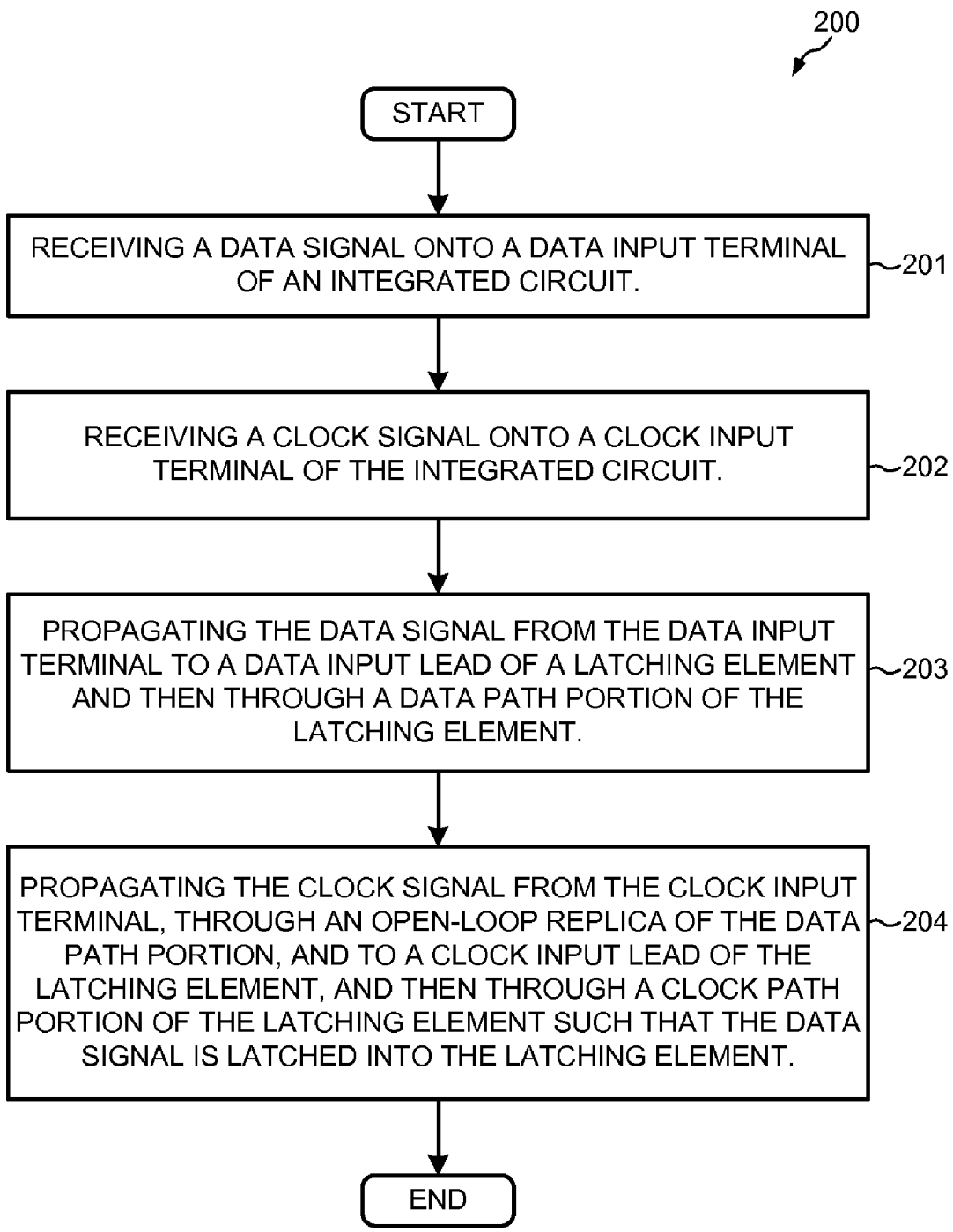
FIG. 11 is a flowchart of a method 200 in accordance with one novel aspect.

FIG. 11 is a flowchart of a method 200 in accordance with one novel aspect. A data signal is received (step 201) onto a data input terminal of an integrated circuit and a clock signal is received (step 202) onto a clock input terminal of the integrated circuit. In one example, the data signal is an edge that represents changing data information as output by a DDR memory. The clock signal is an edge of a strobe signal output by the DDR memory to clock the data information into the integrated circuit. The data signal propagates (step 203) from the data input terminal of the integrated circuit, to a data input lead of a latching element, and then through a data path portion of the latching element. The clock signal propagates (step 204) from the clock input terminal of the integrated circuit, through an open-loop replica of the data path portion, and to a clock input lead of the latching element, and then through a clock path portion of the latching element such that the data signal is latched into the latching element. In one specific example of method 200, a replica of the clock path portion of the latching element is disposed in the data signal path between the data input terminal and the data input lead of the latching element. Depending upon the specific implementation of method 200, an edge of the clock signal received (step 202) may lead, may coincide with, or may follow the data signal received (step 201). The latching of data information into the integrated circuit using the clock signal, from the perspective of a device external to the integrated circuit, may have a positive setup time, a zero set time, or a negative setup time depending on the specific implementation of method 200. In one advantageous aspect, the circuitry through which a data signal passes to reach the data input lead of an ideal latching element within the latching element is substantially identical to the circuitry through which a clock signal passes to reach the clock input lead of the ideal latching element. Because the circuitry in these two signal paths is substantially identical, the propagation delays through the two signal paths change in the same way as a function of process, supply voltage, and temperature. Setup hold times into the latching element therefore remain substantially constant over process, supply voltage, and temperature.

Although certain specific embodiments are described above for instructional purposes, the teachings of this patent document have general applicability and are not limited to the specific embodiments described above. The technique of matching of circuitry in the data path and the clock path to a latching element applies in situations in which the latching element is a flip-flop and applies in situations in which the latching element is a latch. The technique is not limited to use in latching in or clocking in incoming data received from a DDR SDRAM, but rather applies generally to latching in or clocking in data received from other types of integrated circuits. The technique is not limited to use in latching in or clocking in incoming data into an integrated circuit, but rather also sees use in applications where data is transferred between two parts of the same integrated circuit. Accordingly, various modifications, adaptations, and combinations of the various features of the described specific embodiments can be practiced without departing from the scope of the claims that are set forth below.

What is claimed is:

1. An integrated circuit comprising:
a latching element comprising a data input lead, a clock input lead, a data path portion, and a clock path portion;
a data terminal that is coupled to the data input lead of the latching element such that a data signal on the data terminal passes to the data input lead of the latching element and then through the data path portion of the latching element;
a clock input terminal; and
an open-loop replica of the data path portion of the latching element, wherein the open-loop replica is coupled such that a clock signal on the clock input terminal passes through the open-loop replica to the clock input lead of the latching element and then through the clock path portion of the latching element, wherein the latching element is a single latch, wherein an edge of the clock signal causes data information communicated by the data signal to be latched into the single latch, and wherein the single latch is a first latching element of the integrated circuit into which the data information is latched.

2. The integrated circuit of claim 1, wherein the data path portion includes a latch circuit that is operable in a transparent mode and in a latched mode, and wherein the open-loop replica includes a latch circuit of substantially identical construction to the latch circuit of the data path portion except that the latch circuit of the open-loop replica is permanently configured to be in a transparent mode.

3. The integrated circuit of claim 1, wherein the data path portion includes a transmission gate that can be enabled or disabled, and wherein the open-loop replica includes a transmission gate of substantially identical construction to the transmission gate of the data path portion except that the transmission gate of the open-loop replica is permanently configured to be enabled.

4. The integrated circuit of claim 1, wherein the data input lead of the latching element is coupled to the data terminal via a first input protection circuit, and wherein the open-loop replica is coupled to the clock input terminal via a second input protection circuit.

5. An integrated circuit comprising:
a latching element comprising a data input lead, a clock input lead, a data path portion, and a clock path portion;
a data terminal that is coupled to the data input lead of the latching element such that a data signal on the data terminal passes to the data input lead of the latching element and then through the data path portion of the latching element;
a clock input terminal;
an open-loop replica of the data path portion of the latching element, wherein the open-loop replica is coupled such that a clock signal on the clock input terminal passes through the open-loop replica to the clock input lead of the latching element and then through the clock path portion of the latching element; and
a replica of the clock path portion of the latching element, wherein the replica of the clock path portion is coupled such that the data signal on the data terminal passes through the replica of the clock path portion to the data input lead of the latching element and then through the data path portion of the latching element.

6. The integrated circuit of claim 1, wherein the data signal is one data signal of a plurality of data signals received in parallel onto the integrated circuit, wherein an edge of the clock signal causes multiple bits of data information communicated by the plurality of data signals to be latched simultaneously into a register within the integrated circuit, and wherein the latching element is a part of the register.

7. The integrated circuit of claim 1, wherein the clock signal is a Double-Data Rate (DDR) strobe signal, and wherein the data signal is a data signal that is substantially time-aligned with respect to an edge of the DDR strobe signal.

8. A method comprising:
receiving a data signal onto a data terminal of an integrated circuit;
receiving a clock signal onto a clock input terminal of the integrated circuit;
propagating the data signal from the data terminal to a data input lead of a latching element and then through a data path portion of the latching element; and
propagating the clock signal from the clock input terminal, through an open-loop replica circuit, to a clock input lead of the latching element, and then through a clock path portion of the latching element such that the latching element latches the data signal, wherein the open-loop replica circuit is of substantially identical construction to the data path portion of the latching element except that the open-loop replica circuit is permanently configured to be enabled such that a signal on the clock input terminal passes through the open-loop replica circuit to the clock input lead of the latching element, wherein the latching element is a single latch, wherein an edge of the clock signal causes data information communicated by the data signal to be latched into the single latch, and wherein the single latch is a first latching element of the integrated circuit into which the data information is latched.

9. The method of claim 8, wherein the data signal and the clock signal are received onto the integrated circuit from another integrated circuit.

10. The method of claim 8, wherein the data signal and the clock signal are received onto the integrated circuit from a Double-Data Rate (DDR) memory integrated circuit.

11. A method comprising:
receiving a data signal onto a data terminal of an integrated circuit;
receiving a clock signal onto a clock input terminal of the integrated circuit;
propagating the data signal from the data terminal to a data input lead of a latching element and then through a data path portion of the latching element; and
propagating the clock signal from the clock input terminal, through an open-loop replica circuit, to a clock input lead of the latching element, and then through a clock path portion of the latching element such that the latching element latches the data signal, wherein the open-loop replica circuit is of substantially identical construction to the data path portion of the latching element except that the open-loop replica circuit is permanently configured to be enabled such that a signal on the clock input terminal passes through the open-loop replica circuit to the clock input lead of the latching element, wherein the data signal propagates from the data terminal, through a second replica circuit, and then through the data path portion of the latching element, and wherein the second replica circuit is a replica of the clock path portion of the latching element.

12. The method of claim 11, wherein the data terminal is one of a plurality of substantially identical data terminals, wherein the data signal is one of a plurality of data signals, wherein the second replica circuit is one of a plurality of substantially identical replica circuits, wherein the latching element is one of a plurality of substantially identical latching elements, and wherein the clock signal causes the plurality of latching elements to latch the plurality of data signals simultaneously into the plurality of latching elements.

13. An integrated circuit comprising:
a latching element comprising a data input lead, a clock input lead, a data path circuit, and a clock path circuit;
a data terminal that is coupled to the data input lead of the latching element such that a data signal on the data terminal passes to the data input lead of the latching element and then through the data path circuit of the latching element;
a clock input terminal; and
means for receiving a clock signal from the clock input terminal and for communicating the clock signal through replica circuitry that is substantially identical to the data path circuit such that a delayed clock signal is generated and is supplied onto the clock input lead of the latching element, wherein the latching element is a single latch, wherein an edge of the clock signal causes data information communicated by the data signal to be latched into the single latch, and wherein the single latch is a first latching element of the integrated circuit into which the data information is latched.

14. The integrated circuit of claim 13, wherein the data path circuit includes a transparent latch that is operable in a transparent mode and in a latched mode.

15. An integrated circuit comprising:
a latching element comprising a data input lead, a clock input lead, a data path circuit, and a clock path circuit;
a data terminal that is coupled to the data input lead of the latching element such that a data signal on the data terminal passes to the data input lead of the latching element and then through the data path circuit of the latching element;
a clock input terminal;
means for receiving a clock signal from the clock input terminal and for communicating the clock signal through replica circuitry that is substantially identical to the data path circuit such that a delayed clock signal is generated and is supplied onto the clock input lead of the latching element; and
means for receiving the data signal from the data terminal and for communicating the data signal through replica circuitry that is substantially identical to the clock path circuit such that the data signal that passes to the data input lead of the latching element is a delayed version of the data signal received from the data terminal.

16. An integrated circuit comprising:
a latching element comprising a data input lead, a clock input lead, a data path portion, and a clock path portion, wherein a propagation delay through the data path portion changes over voltage and temperature;
a data terminal that is coupled to the data input lead of the latching element such that a data signal on the data terminal passes to the data input lead of the latching element and then through the data path portion of the latching element;
a clock input terminal;

an open-loop replica of the data path portion of the latching element, wherein the open-loop replica is coupled such that a clock signal on the clock input terminal passes through the open-loop replica to the clock input lead of the latching element and then through the clock path portion of the latching element, wherein a propagation delay through the open-loop replica changes over voltage and temperature in a same way that the propagation delay through the data path portion of the latching element changes over voltage and temperature; and a replica of the clock path portion of the latching element, wherein the replica of the clock path portion is coupled such that the data signal on the data terminal passes through the replica of the clock path portion to the data input lead of the latching element and then through the data path portion of the latching element.

17. The integrated circuit of claim 16, wherein the data path portion includes a latch circuit that is operable in a transparent mode and in a latched mode, and wherein the open-loop replica includes a latch circuit of substantially identical construction to the latch circuit of the data path portion except that the latch circuit of the open-loop replica is permanently configured to be in a transparent mode.

18. The integrated circuit of claim 16, wherein the data path portion includes a transmission gate that can be enabled or disabled, and wherein the open-loop replica includes a transmission gate of substantially identical construction to the transmission gate of the data path portion except that the transmission gate of the open-loop replica is permanently configured to be enabled.

19. The integrated circuit of claim 16, wherein the data input lead of the latching element is coupled to the data terminal via a first input protection circuit, and wherein the open-loop replica is coupled to the clock input terminal via a second input protection circuit.

20. The integrated circuit of claim 16, wherein the latching element is a flip-flop, and wherein an edge of the clock signal causes data information communicated by the data signal to be latched into the flip-flop.

21. The integrated circuit of claim 20, wherein the latching element is a first latching element of the integrated circuit into which the data information is latched.

22. The integrated circuit of claim 16, wherein the data signal is one data signal of a plurality of data signals received in parallel onto the integrated circuit, wherein an edge of the clock signal causes multiple bits of data information communicated by the plurality of data signals to be latched simultaneously into a register within the integrated circuit, and wherein the latching element is a part of the register.

23. The integrated circuit of claim 16, wherein the clock signal is a Double-Data Rate (DDR) strobe signal, and wherein the data signal is a data signal that is substantially time-aligned with respect to an edge of the DDR strobe signal.

24. A method comprising:
receiving a data signal onto a data terminal of an integrated circuit;
receiving a clock signal onto a clock input terminal of the integrated circuit;
propagating the data signal from the data terminal to a data input lead of a latching element and then through a data path portion of the latching element, wherein a propagation delay through the data path portion changes as a function of voltage and temperature; and
propagating the clock signal from the clock input terminal, through an open-loop replica circuit, to a clock input lead of the latching element, and then through a clock path portion of the latching element such that the latching element latches the data signal, wherein the open-loop replica circuit is of substantially identical construction to the data path portion of the latching element except that the open-loop replica circuit is permanently configured to be enabled such that a signal on the clock input terminal passes through the open-loop replica circuit to the clock input lead of the latching element , and wherein a propagation delay through the open-loop replica changes over voltage and temperature in a same way that the propagation delay through the data path portion of the latching element changes over voltage and temperature, wherein the data signal propagates from the data terminal, through a second replica circuit, and then through the data path portion of the latching element, and wherein the second replica circuit is a replica of the clock path portion of the latching element.

25. The method of claim 24, wherein the data signal and the clock signal are received onto the integrated circuit from another integrated circuit.

26. The method of claim 24, wherein the data signal and the clock signal are received onto the integrated circuit from a Double-Data Rate (DDR) memory integrated circuit.

27. The method of claim 24, wherein the latching element is taken from the group consisting of: a flip-flop and a latch.

28. The method of claim 24, wherein the latching element is a first latching element of the integrated circuit into which the data signal is latched.

29. The method of claim 24, wherein the data terminal is one of a plurality of substantially identical data terminals, wherein the data signal is one of a plurality of data signals, wherein the second replica circuit is one of a plurality of substantially identical replica circuits, wherein the latching element is one of a plurality of substantially identical latching elements, and wherein the clock signal causes the plurality of latching elements to latch the plurality of data signals simultaneously into the plurality of latching elements.

* * * * *